(12) United States Patent
Wu et al.

(10) Patent No.: US 9,245,615 B2
(45) Date of Patent: Jan. 26, 2016

(54) BOOST SYSTEM FOR DUAL-PORT SRAM

(71) Applicant: TAIWAN SEMICONDUCTOR MANUFACTURING COMPANY LTD., Hsinchu (TW)

(72) Inventors: Ching-Wei Wu, Nantou County (TW); He-Zhou Wan, Shanghai (CN); Ming-En Bu, Shanghai (CN); Xiuli Yang, Shanghai (CN); Cheng Hung Lee, Hsinchu (TW); Mu-Jen Huang, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/220,025

(22) Filed: Mar. 19, 2014

(65) Prior Publication Data

US 2015/0248928 A1    Sep. 3, 2015

(30) Foreign Application Priority Data

Mar. 3, 2014   (CN) .......................... 2014 1 0074379

(51) Int. Cl.
*G11C 11/419*   (2006.01)

(52) U.S. Cl.
CPC ..................................... *G11C 11/419* (2013.01)

(58) Field of Classification Search
CPC .................................................... G11C 11/419
USPC ........... 365/154, 189.04, 189.07, 190, 230.05
See application file for complete search history.

(56) References Cited

U.S. PATENT DOCUMENTS

| 4,660,177 | A | * | 4/1987 | O'Connor | G11C 11/412 |
| | | | | | 365/154 |
| 5,282,174 | A | * | 1/1994 | Little | G11C 8/16 |
| | | | | | 365/189.04 |
| 5,303,231 | A | * | 4/1994 | Shinomiya | H04J 3/1682 |
| | | | | | 370/360 |
| 6,075,720 | A | * | 6/2000 | Leung | G11C 5/147 |
| | | | | | 257/E21.019 |
| 6,181,634 | B1 | * | 1/2001 | Okita | G11C 7/1045 |
| | | | | | 365/189.04 |
| 6,584,034 | B1 | * | 6/2003 | Hsu | G11C 7/18 |
| | | | | | 365/189.04 |
| 7,495,948 | B2 | * | 2/2009 | Suzuki | G11C 5/14 |
| | | | | | 365/154 |
| 8,451,679 | B1 | * | 5/2013 | Sharpe-Geisler | G11C 7/12 |
| | | | | | 365/189.06 |
| 2001/0010654 | A1 | * | 8/2001 | Shau | G11C 7/1006 |
| | | | | | 365/222 |
| 2003/0076731 | A1 | * | 4/2003 | Terada | G11C 8/16 |
| | | | | | 365/230.05 |
| 2006/0092740 | A1 | * | 5/2006 | Nii | G11C 8/10 |
| | | | | | 365/221 |
| 2008/0056053 | A1 | * | 3/2008 | Rao | G11C 11/413 |
| | | | | | 365/230.05 |
| 2009/0052262 | A1 | * | 2/2009 | Nii | G11C 8/08 |
| | | | | | 365/189.14 |
| 2009/0273994 | A1 | * | 11/2009 | Chang | G11C 7/22 |
| | | | | | 365/194 |
| 2011/0235444 | A1 | * | 9/2011 | Chuang | G11C 11/413 |
| | | | | | 365/189.16 |
| 2011/0317508 | A1 | * | 12/2011 | Kulkarni | G11C 8/08 |
| | | | | | 365/230.06 |
| 2012/0026619 | A1 | * | 2/2012 | Wilson | G11B 7/00458 |
| | | | | | 360/31 |
| 2012/0163110 | A1 | * | 6/2012 | Sinha | G11C 7/227 |
| | | | | | 365/203 |
| 2013/0194882 | A1 | * | 8/2013 | Ishii | G11C 7/222 |
| | | | | | 365/194 |
| 2014/0063977 | A1 | * | 3/2014 | Park | G11C 11/4076 |
| | | | | | 365/189.05 |
| 2014/0307501 | A1 | * | 10/2014 | Louie | G11C 11/417 |
| | | | | | 365/154 |

* cited by examiner

*Primary Examiner* — Vu Le
*Assistant Examiner* — Sung Cho
(74) *Attorney, Agent, or Firm* — WPAT, P.C.; Anthony King

(57) ABSTRACT

A boost system for dual-port SRAM includes a comparator and a boost circuit. The comparator is configured to compare a first row address of a first port and a second row address of a second port, and output a first enable signal. The boost circuit is configured to boost a voltage difference between a first voltage source and a second voltage source according to the first enable signal.

20 Claims, 15 Drawing Sheets

BOOST SYSTEM FOR DUAL-PORT SRAM

TECHNICAL FIELD

The present disclosure is related to a boost system for dual-port SRAM, a dual-port SRAM and a boost method.

BACKGROUND

A dual-port SRAM (Static Random Access Memory) includes several cells. Each cell has two independent ports and allows for simultaneous read/write operation. For example, the two ports may simultaneously operate at a read mode or one port operates at a read mode while the other port simultaneously operates at a write mode.

BRIEF DESCRIPTION OF THE DRAWINGS

The details of one or more embodiments of the disclosure are set forth in the accompanying drawings and the description below. Other features and advantages of the disclosure will be apparent from the description, drawings and claims.

Like reference symbols in the various drawings indicate like elements.

DETAIL DESCRIPTION

Figure 1:
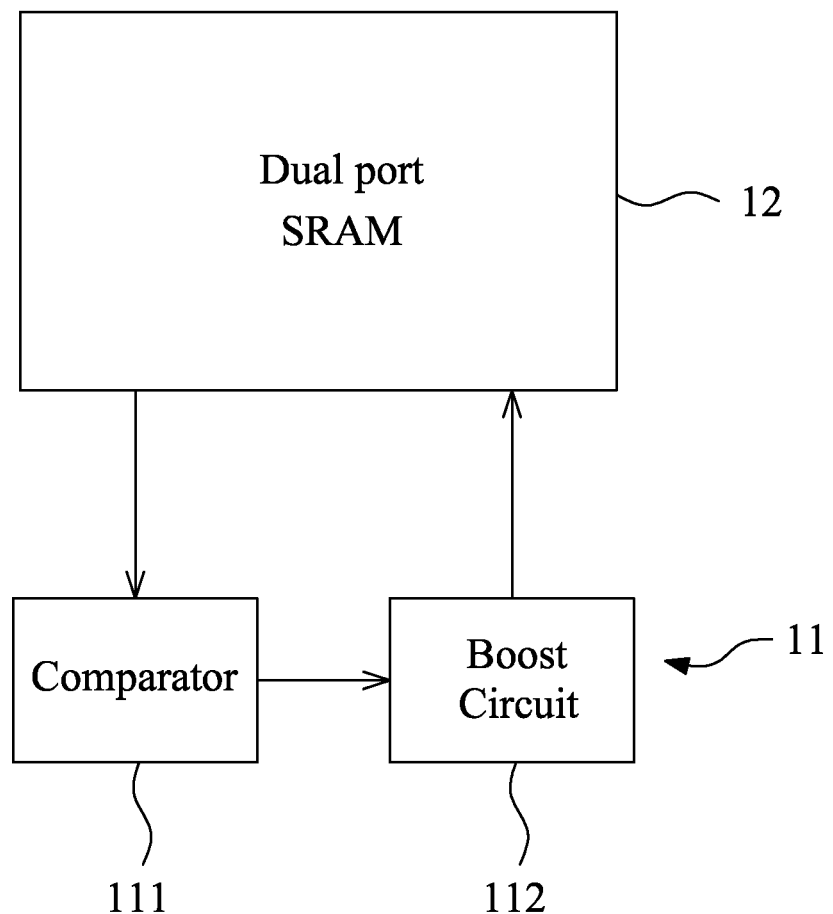
FIG. 1 is a schematic block diagram of a boost system for a dual-port SRAM in accordance with some embodiments.

Embodiments, or examples, of the disclosure illustrated in the drawings are now described using specific language. It will nevertheless be understood that no limitation of the scope of the disclosure is thereby intended. Any alterations and modifications in the described embodiments, and any further applications of principles described in this document are contemplated as would normally occur to one of ordinary skill in the art to which the disclosure relates. Reference numerals may be repeated throughout the embodiments, but this does not necessarily require that feature(s) of one embodiment apply to another embodiment, even if they share the same reference numeral. It will be understood that when an element is referred to as being "connected to" or "coupled to" another element, it may be directly connected to or coupled to the other element, or intervening elements may be present.

FIG. 1 is a schematic block diagram of a boost system 11 for a dual-port SRAM 12 in accordance with some embodiments. In an embodiment, the boost system 11 includes a comparator 111 and a boost circuit 112. The comparator 111 is configured to compare a first row address of a first port and a second row address of a second port in each cell of the dual-port SRAM 12. After comparing the first row address of the first port and the second row address of the second port, the comparator 111 outputs a first enable signal to the boost circuit 112. If the first row address of the first port is the same as the second row address of the second port in a selected cell, it means that the two ports of the selected cell simultaneously operate.

The boost circuit 112 is configured to boost a voltage difference between a first voltage source and a second voltage source of the selected cell in the dual-port SRAM 12 according to the first enable signal. In an embodiment, the boost circuit 112 can be configured to boost the first voltage source, and the second voltage source is unchanged so that the voltage difference between the first voltage source and the second voltage source of the selected cell in the dual-port SRAM 12 can be boosted. In another embodiment, the boost circuit 112 can be configured to decrease the second voltage source, and the first voltage source is unchanged so as to boost the voltage difference between the first voltage source and the second voltage source of the selected cell in the dual-port SRAM 12.

Therefore, when the two ports of the selected cell simultaneously operate, the voltage difference between the first voltage source and the second voltage source of the selected cell in the dual-port SRAM 12 is boosted so that the cell current of the selected cell will not be decreased during simultaneous operation. Moreover, the SNM (Static Noise Margin) and WM (Write Margin) of the dual-port SRAM can be improved.

Figure 2:
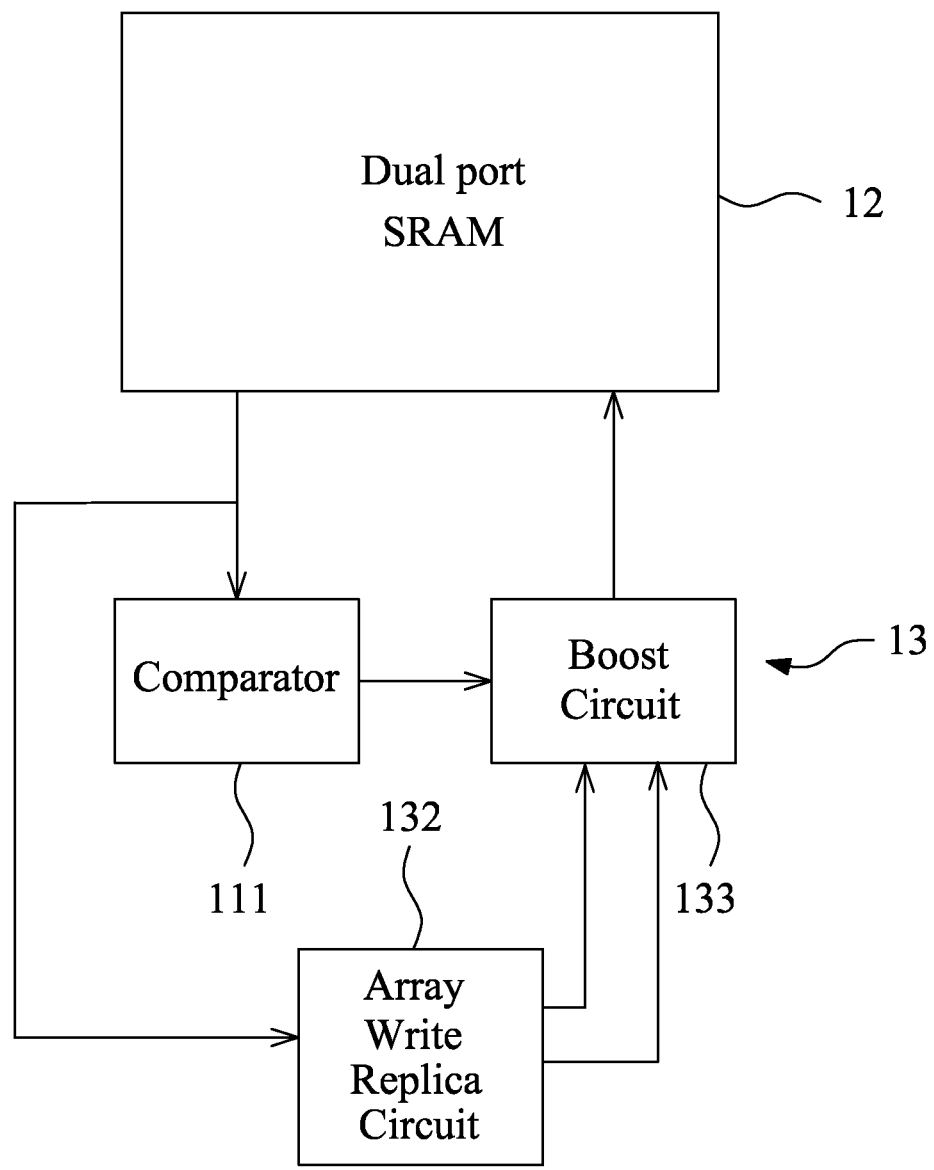
FIG. 2 is a schematic block diagram of a boost system for a dual-port SRAM in accordance with some embodiments.

FIG. 2 is a schematic block diagram of a boost system 13 for dual-port SRAM 12 in accordance with some embodiments. In an embodiment, the boost system 13 includes comparator 111, an array write replica circuit 132 and a boost circuit 133. The comparator 111 is configured to compare a first row address of a first port and a second row address of a second port in each cell of the dual-port SRAM 12. After comparing the first row address of the first port and the second row address of the second port, the comparator 111 outputs a first enable signal to the boost circuit 133. The array write replica circuit 132 is configured to simulate a write operation of the dual-port SRAM 12 so as to delay a first predetermined time, then the array write replica circuit 132 outputs a second enable signal and a third enable signal to the boost circuit 133.

The boost circuit 133 is configured to receive the first enable signal, the second enable signal and the third enable signal, and to boost a voltage difference between a first voltage source and a second voltage source of the dual-port SRAM 12 according to the first enable signal, the second enable signal and the third enable signal.

Therefore, when the two ports of the selected cell simultaneously operate, the voltage difference between the first voltage source and the second voltage source of the selected cell in the dual-port SRAM 12 is boosted after delaying the first predetermined time so that the cell current of the selected cell will not be decreased during simultaneous operation. Moreover, the SNM and WM of the dual-port SRAM can be improved.

Figure 3:
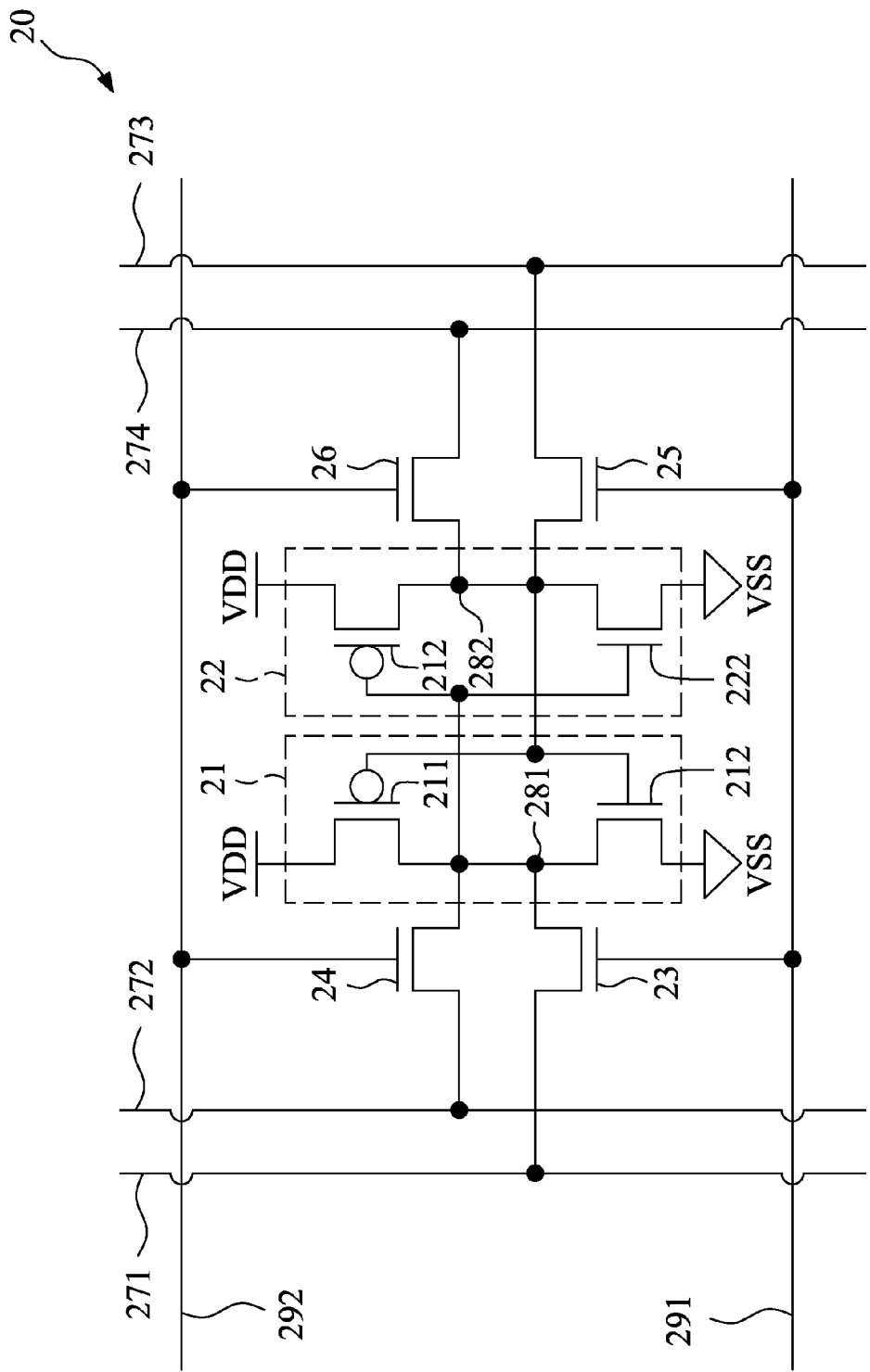
FIG. 3 is a schematic circuit diagram of a cell of a dual-port SRAM in accordance with some embodiments.

FIG. 3 is a schematic circuit diagram of a cell 20 of dual-port SRAM 12 in accordance with some embodiments. Referring to FIG. 1 and FIG. 3, the dual-port SRAM 12 includes several cells 20 arranged in a matrix form. In this embodiment, the cell 20 is a standard eight-transistor (8T) dual-port SRAM cell. The cell 20 includes two inverters 21, 22, and four transmission gates 23, 24, 25, 26. A first port bit line 271 is connected to a node 281 through transmission gate 23, and a second port bit line 272 is connected to the node 281 through transmission gate 24. A first port bit line bar 273 is connected to a node 282 through transmission gate 25, and a second port bit line bar 274 is connected to node 282 through transmission gate 26. The bit line and bit line bar for any specific port are more generically referred to as bit signal lines. A transmission gate is an NMOS transistor with its drain connected to a bit line or to a bit line bar, its source connected to a node of an inverter, and its gate connected to a word line.

Transmission gate 23 includes an n-type metal-oxide-semiconductor (NMOS) transistor. A drain of the NMOS transistor is coupled to the first port bit line 271. A source of the NMOS transistor is coupled to node 281. A gate of the NMOS transistor is coupled to a first port word line 291.

Transmission gate 24 also includes an NMOS transistor. A drain of the NMOS transistor is coupled to the second port bit line 272. A source of the NMOS transistor is coupled to node 281. A gate of the NMOS transistor is coupled to a second-port word line 292.

Transmission gate 25 also includes an NMOS transistor. A drain of the NMOS transistor is coupled to the first port bit line bar 273. A source of the NMOS transistor is coupled to node 282. A gate of the NMOS transistor is coupled to the first port word line 291.

Transmission gate 26 also includes an NMOS transistor. A drain of the NMOS transistor is coupled to the second port bit line bar 274. A source of the NMOS transistor is coupled to node 282. A gate of the NMOS transistor is coupled to a second-port word line 292.

Transmission gates 23 and 25 are controlled by the first port word line 291. Transmission gates 24 and 26 are controlled by the second port word line 292. The inverter 21 includes a PMOS transistor 211 and an NMOS transistor 212, and the inverter 22 includes a PMOS transistor 221 and an NMOS transistor 222.

A first voltage source VDD is connected to a source of the PMOS transistor 211 of the inverter 21 and a source of the PMOS transistor 221 of the inverter 22. A drain of the PMOS transistor 211 is coupled at the node 281, and a drain of the PMOS transistor 221 is coupled at the node 282. A second voltage source VSS, for example, ground, is connected to a source of an NMOS transistor 212 of the inverter 21 and a source of an NMOS transistor 222 of the inverter 22. A drain of the NMOS transistor 212 is coupled at the node 281, and a drain of NMOS transistor 222 is coupled at the node 282. The node 281 is connected to a gate of PMOS transistor 221 and to a gate of NMOS transistor 222. The node 282 is connected to a gate of PMOS transistor 211 and to a gate of NMOS transistor 212.

As shown in FIG. 3, the two inverters 112 and 124 are cross connected, and the node 281 of the inverter 21 is connected to the gates of inverter 22, while the node 282 of inverter 22 is connected to the gates of inverter 21. This cross-coupling locks inputted data in a stable storage. This stored data is available for non-destructive read. A dual-port SRAM can sustain two simultaneous read operations without losing the stable memory data state.

Referring to FIG. 1 and FIG. 3, when the two ports of the cell 20 simultaneously operate, the boost circuit 112 can boost the voltage difference between the first voltage source VDD and the second voltage source VSS. As stated previously, the boost circuit 112 can boost the first voltage source VDD or decrease the second voltage source VSS in boosting the voltage difference between the first voltage source VDD and the second voltage source VSS during the simultaneous operation period. By boosting the voltage difference between the first voltage source VDD and the second voltage source VSS, the cell current of the cell 20 will not be decreased during two simultaneous operations. Therefore, the SNM (Static Noise Margin) and WM (Write Margin) of the dual-port SRAM can be improved.

Figure 4:
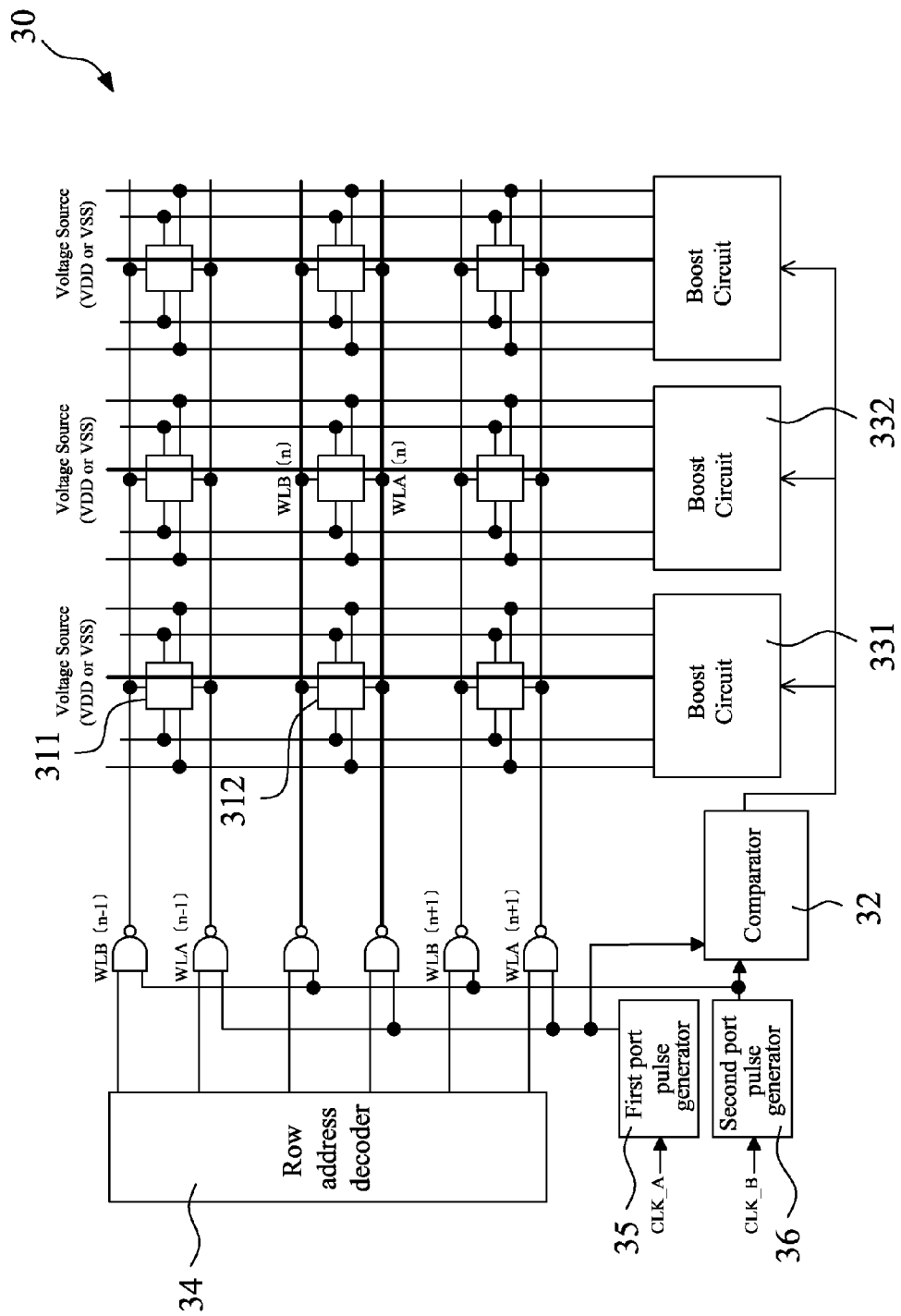
FIG. 4 is a schematic block diagram of a dual-port SRAM having a boost system in accordance with some embodiments.

FIG. 4 is a schematic circuit diagram of a dual-port SRAM 30 having a boost system in accordance with some embodiments. The dual-port SRAM 30 includes several cells, a comparator 32 and several boost circuits 331, 332. For illustration, only exemplary boost circuits 331, 332 and exemplary cells 311, 312 are labeled. The cells 311, 312 are the same as the cell 20 in FIG. 3, and will not be described in detail. The cells 311, 312 are arranged in a matrix form, and each cell has a first row address of a first port and a second row address of a second port. The dual-port SRAM 30 further includes a row address decoder 34 to receive the first row address of the first port and the second row address of the second port and to decode the first row address of the first port and the second row address of the second port to enable the first port word line or the second port word line associated with a selected cell.

The dual-port SRAM 30 further includes a first port pulse generator 35 and a second port pulse generator 36. The first port pulse generator 35 and the second port pulse generator 36 are configured to receive a first port clock CLK_A and a second clock CLK_B, respectively, and output pluses to enable the first port word line or the second port word line of the selected cell. The first port pulse generator 35 and the second port pulse generator 36 also enable the comparator 32.

Figure 5:
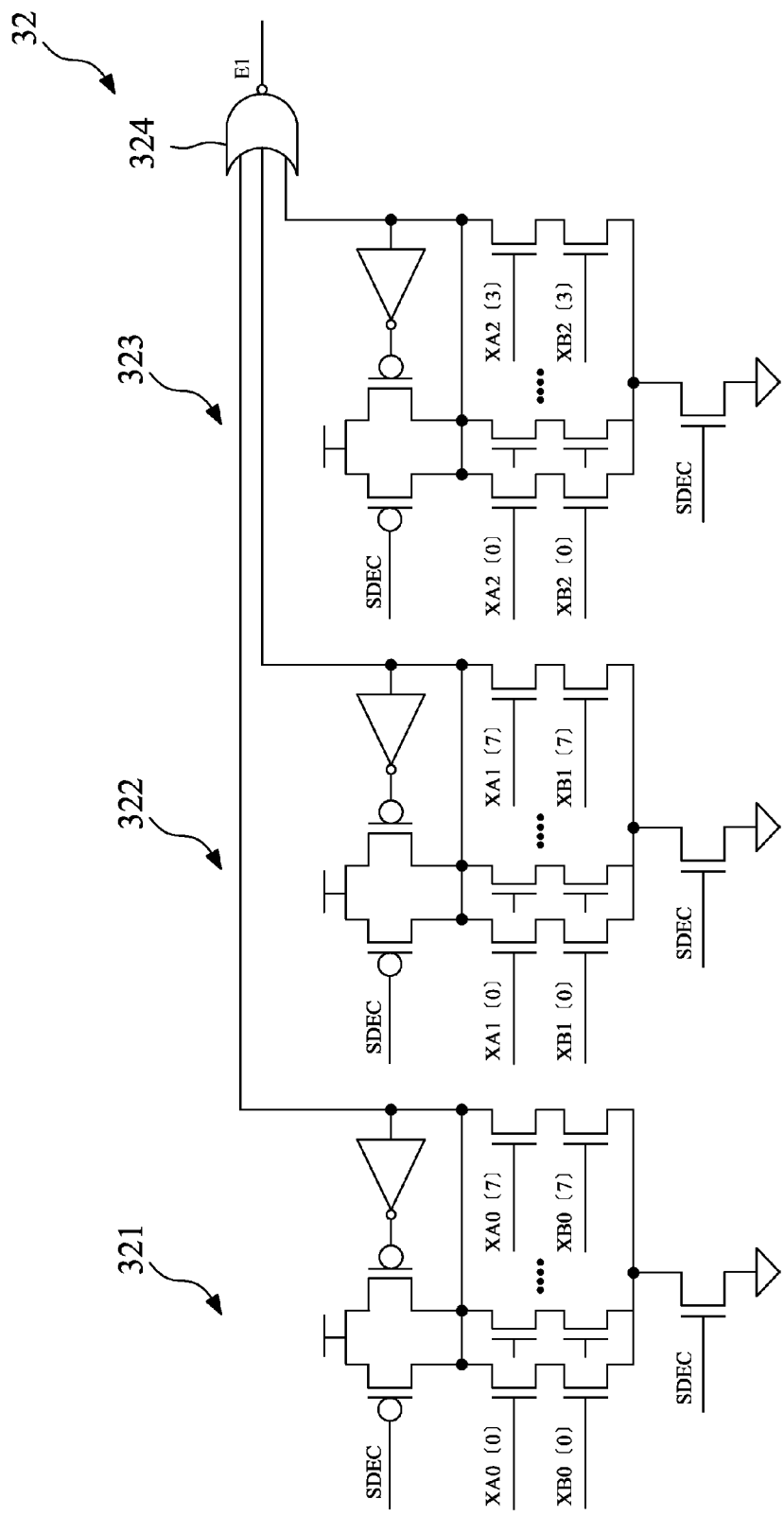
FIG. 5 is a schematic circuit diagram of a comparator in accordance with some embodiments.

The comparator 32 is configured to compare the first row address of the first port and the second row address of the second port, and output a first enable signal to the boost circuits 331, 332. In an embodiment, the first row address of the first port and the second row address of the second port are the same as the output of the row address decoder 34. FIG. 5, is a schematic circuit diagram of comparator 32 in accordance with some embodiments. Referring to FIG. 5, the comparator 32 includes a first comparing circuit 321, a second comparing circuit 322, a third comparing circuit 323 and a NOR gate 324. An SDEC signal of the comparator 32 is a complex signal of the pluses from the first port pulse generator 35 and the second port pulse generator 36. For example, an AND gate is used to receive the pluses from the first port pulse generator 35 and the second port pulse generator 36 and output the SDEC signal to the comparator 32.

In an embodiment, for an 8-bit application, 8-bits are divided into a first 3-bit group, a second 3-bit group and a 2-bit group. For example, an 8-bit signal [00100011] is divided into a first 3-bit group [001] formed by the three most significant bits of the 8-bit signal, a second 3-bit group [000] formed by the three intermediate significant bits, and a 2-bit group [11] formed by the two least significant bits. The first 3-bit group is fed to and then decoded by the first comparing circuit 321. The second 3-bit group is fed to and then decoded by the second comparing circuit 322. The 2-bit group is fed to and then decoded by the third comparing circuit 323. As a result, at the first comparing circuit 321, the first 3-bit group [001] is decoded into XA0[0]-XA0[7], for example [00000010], for the first port, or decoded into XB0[0]-XB0[7], for example [00000010], for the second port. Thus, only one bit of the input XA0[0]-XA0[7] is logical high "H" and also only one bit of the input XB0[0]-XB0[7] is logical high "H" after decoding. That is, one of the transistors connected to the input XA0[0]-XA0[7] is turned ON, and also one of the transistors connected to the input XB0[0]-XB0[7] is turned ON. If the two ports of the selected cell simultaneously operate, the input XA0[0]-XA0[7] is the same as the input XB0[0]-XB0[7]. And the NMOS transistor controlled by the SDEC signal is turned ON. Then, the first comparing circuit 321 outputs a logical low "L" signal to the NOR gate 324.

If the first row address of the first port, including XA0[0]-XA0[7], XA1[0]-XA1[7]0 and XA2[0]-XA2[3], are the same as the second row address of the second port, including XB0[0]-XB0[7], XB1[0]-XB1[7] and XB2[0]-XB2[3], the first comparing circuit 321, the second comparing circuit 322 and the third comparing circuit 323 output logical "L" signals to the NOR gate 324. Then, the NOR gate 324 outputs a logical "H" signal. Thus, only when the first row address of the first port are the same as the second row address of the second port, the comparator 32 outputs the first enable signal E1 of logical "H" to the boost circuits 331, 332.

Figure 6:
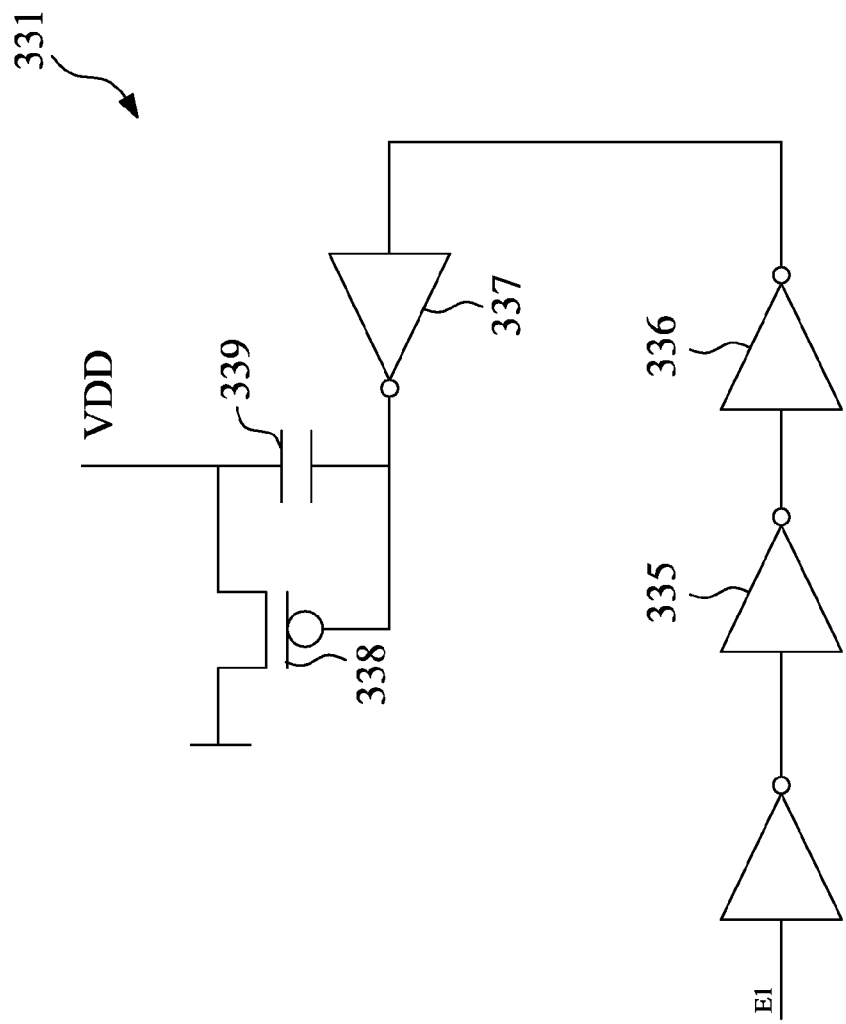
FIG. 6 is a schematic circuit diagram of a boost circuit in accordance with some embodiments.

Referring back to FIG. 4, the boost circuits 331, 332 are configured to boost a voltage difference between a first voltage source and a second voltage source according to the first enable signal from the comparator 32. In an embodiment, each boost circuit is disposed on a column position of the dual-port SRAM 30, and is configured to boost the first voltage source for the cells arranged in the column. FIG. 6 is a schematic circuit diagram of boost circuit 331 in accordance with some embodiments. Referring to FIG. 6, the boost circuit 331 includes several logic gates 335, 336, 337, a transistor 338 and a capacitor 339. In an embodiment, the logic gates 335, 336, 337 are inverters connected in series. Moreover, the transistor 338 includes a PMOS transistor. When the first enable signal E1 is logical "H", the gate of the PMOS transistor 338 is biased at logical "H", and the boost circuit 331 boosts the first voltage source VDD of the cells arranged in the same column of the dual-port SRAM by adding the voltage across the capacitor 339. Further, the comparator 111 and the boost circuit 112 in FIG. 1 can be implemented by the circuit of the comparator 32 in FIG. 5 and the circuit of the boost circuit 331 in FIG. 6, respectively.

Figure 7:
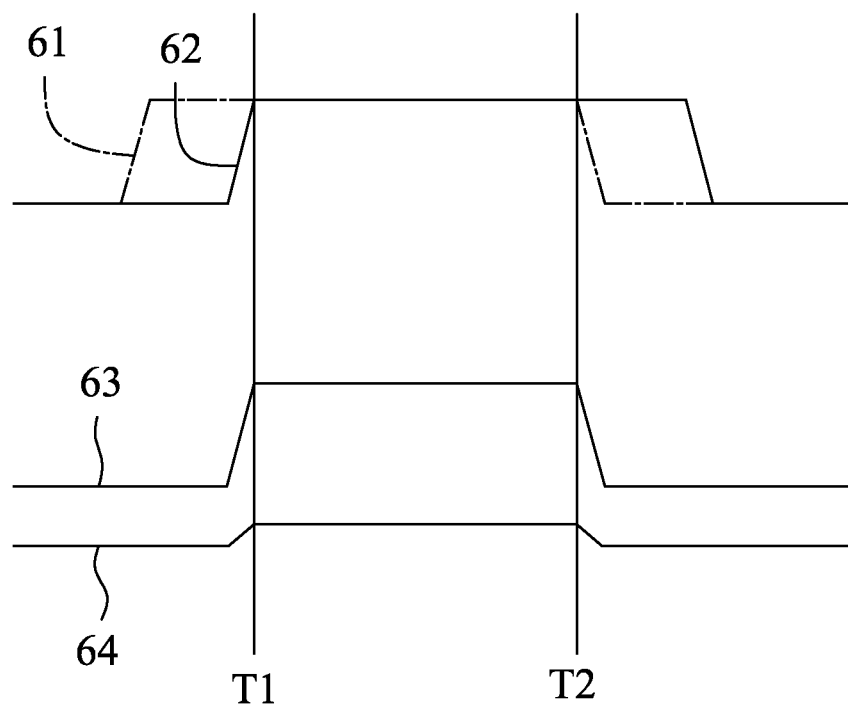
FIG. 7 is a schematic timing diagram illustrating a first port word line, a second port word line, a boost enable signal and a first voltage source in accordance with the embodiments of FIG. 4.

FIG. 7 is a schematic timing diagram illustrating signals on a first port word line 61 and a second port word line 62, a boost enable signal 63 and signals on a first voltage source 64. Referring to FIG. 4 and FIG. 7, in an embodiment, the first port word line 61 and the second port word line 62 are both logical "H" during a period from time T1 to time T2, which means that the two ports of the selected cell simultaneously operate. The boost circuit 331 generates boost enable signal 63 according to the first enable signal, and boosts the first voltage source 64 during the simultaneous operation period from time T1 to time T2, that is, the overlapping period of the first port word line 61 and the second port word line 62.

Figure 8:
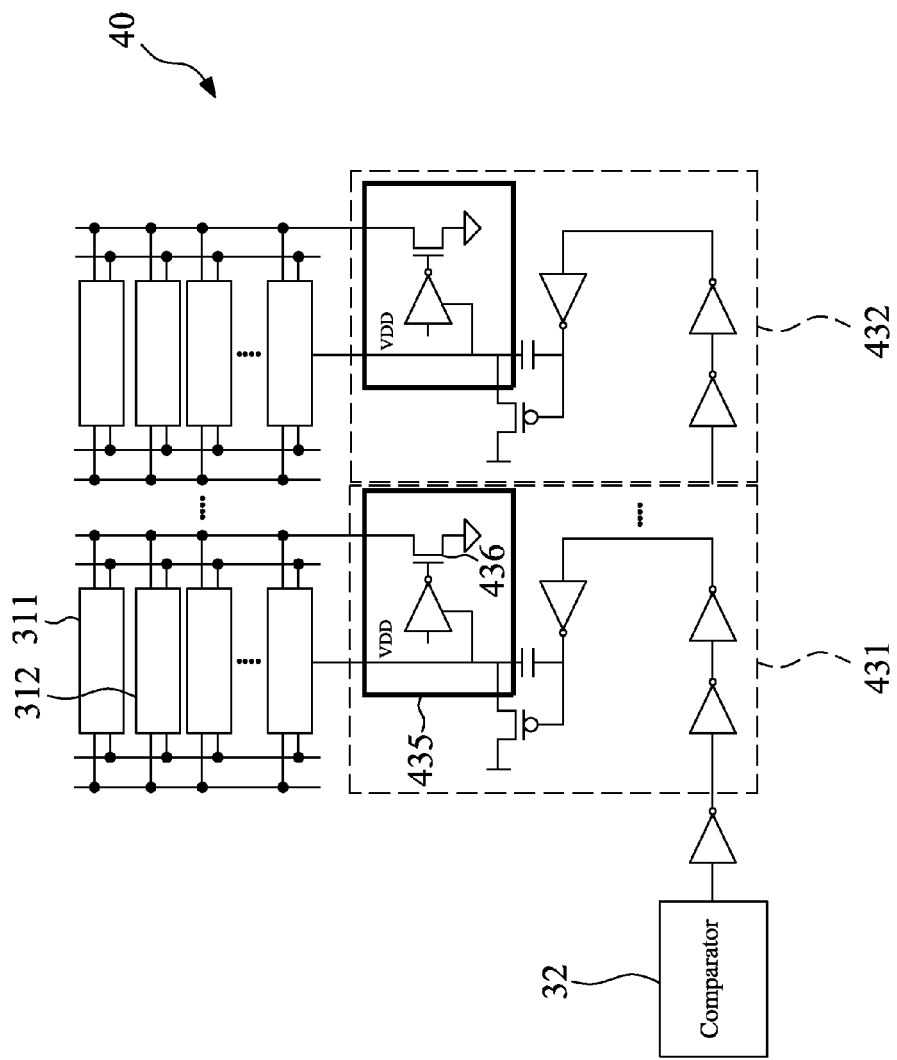
FIG. 8 is a schematic circuit diagram of a dual-port SRAM having a boost system in accordance with some embodiments.

FIG. 8 is a schematic circuit diagram of a dual-port SRAM 40 having a boost system in accordance with some embodiments. The dual-port SRAM 40 is similar to the dual-port SRAM 30 described and illustrated in FIG. 4 except, for example, boost circuits 431, 432. Referring to FIG. 8, the boost circuit 431 further includes a write driver boost circuit 435 to boost a gate voltage of a write driver 436. The write driver 436 is an NMOS transistor. By boosting the gate voltage of the NMOS transistor, the conversion capability of the NMOS transistor is improved. That is, the write driver 436 can be easily turned ON to allow the cell to enter write operation. Thus, the boost circuit 431 can boost both the first voltage source VDD of the cells arranged in the same column of the dual-port SRAM and the gate voltage of the write driver. When one port is at write operation and the other port is at read operation, the gate voltage of a write driver is boosted to improve the write performance during write operation.

Figure 9:
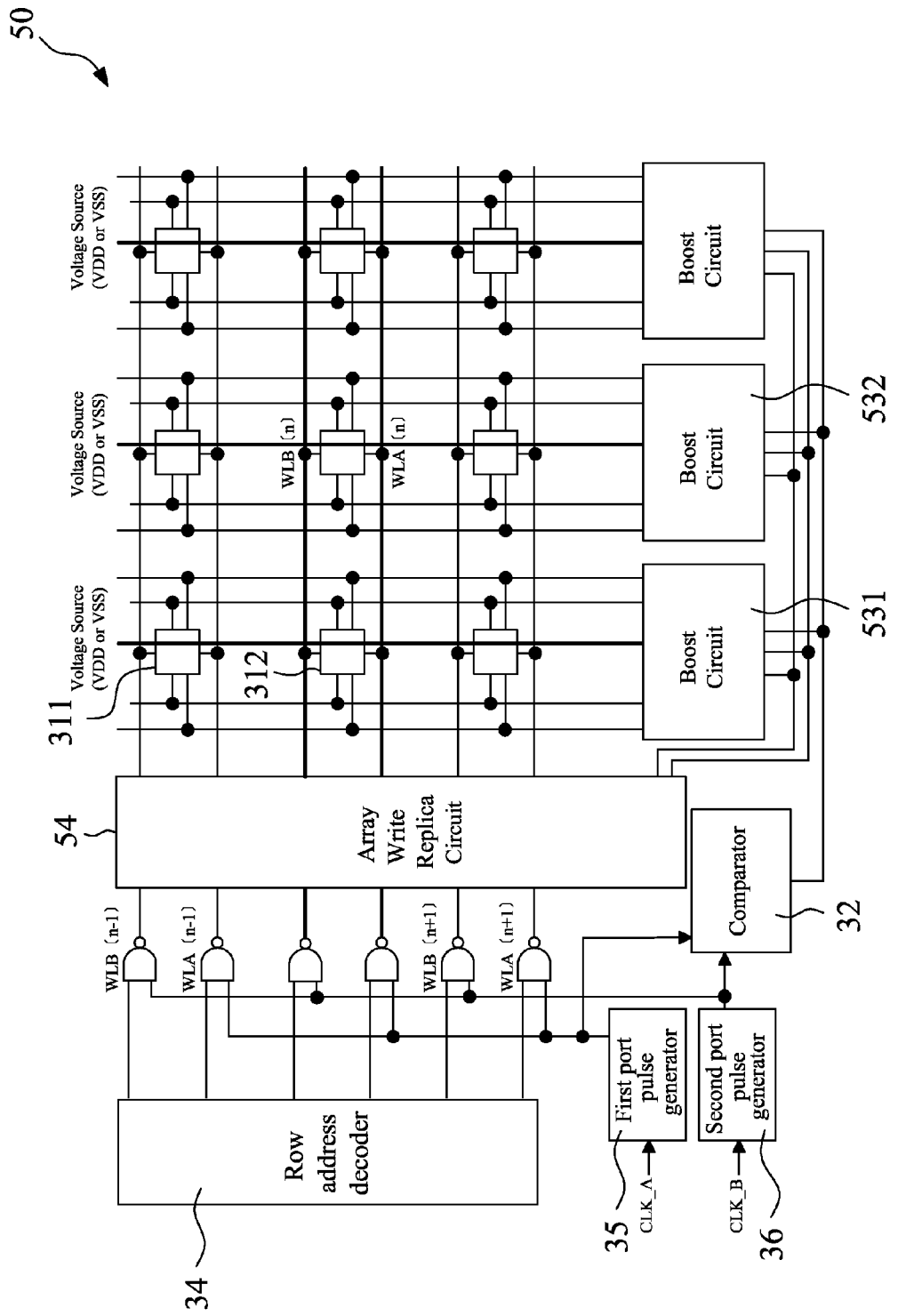
FIG. 9 is a schematic block diagram of a dual-port SRAM having a boost system in accordance with some embodiments.

FIG. 9 is a schematic block diagram of a dual-port SRAM 50 having a boost system in accordance with some embodiments. Compared with the dual-port SRAM 30 in FIG. 4, the dual-port SRAM 50 further includes an array write replica circuit 54 configured to simulate a write operation of the dual-port SRAM, and output a second enable signal and a third enable signal to the boost circuits 531, 532. The boost circuits 531, 532 are configured to boost the voltage difference according to the first enable signal from the comparator 32, and the second enable signal and the third enable signal from the array write replica circuit 54. When one port is at write operation and the other port is at read operation in a selected cell, the array write replica circuit 54 is configured to simulate a write operation of the dual-port SRAM. That is, the array write replica circuit 54 is configured to delay a first predetermined time by simulating the write operation of the dual-port SRAM.

Figure 10:
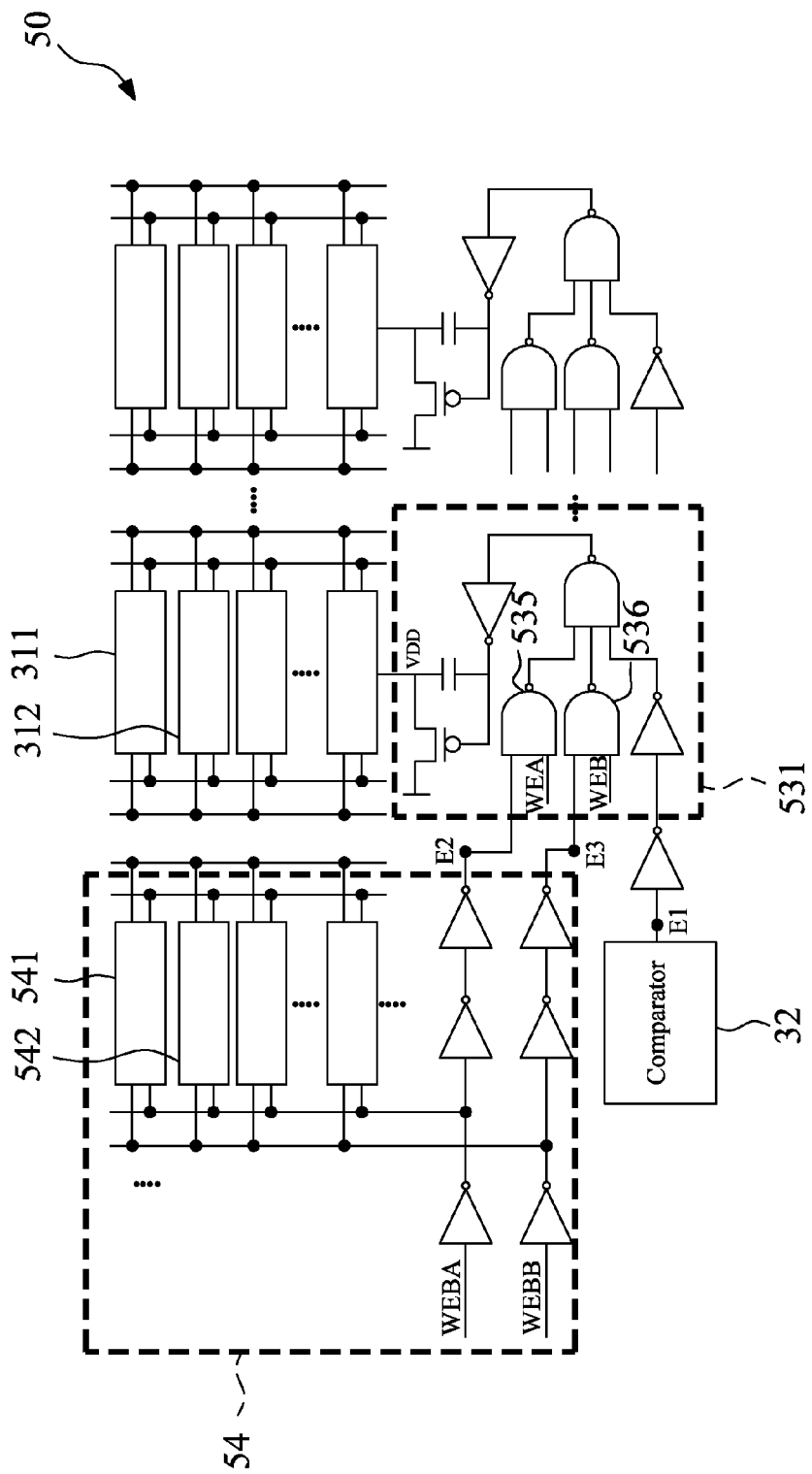
FIG. 10 is a schematic circuit diagram of a dual-port SRAM having a boost system in accordance with the embodiments of FIG. 8.

FIG. 10 is a schematic circuit diagram of dual-port SRAM 50 having a boost system in accordance with the embodiment of FIG. 9. The array write replica circuit 54 includes several cells 541, 542 arranged in a column before the cells 311, 312 of the dual-port SRAM. The cells 541, 542 are the same as the cells 311, 312 so as to simulate the same write operation. The array write replica circuit 54 receives a WEBA signal configured to indicate the status of the write operation of the first port, and a WEBB signal configured to indicate the status of the write operation of the second port. After one of the cells 541, 542 performs the write operation, the array write replica circuit 54 outputs the second enable signal E2 and the third enable signal E3 to the boost circuits 531, 532.

The comparator 32 outputs the first enable signal E1 to the boost circuits 531, 532. Compared with the boost circuit 331 in FIG. 5, the boost circuit 531 further includes several logic gates 535, 536 configured to receive the second enable signal E2 and the third enable signal E3 from the array write replica circuit 54. The logic gates 535, 536 in some embodiments are NAND gates. The NAND gate 535 is configured to receive the second enable signal E2 and a WEA signal, which is an inverted signal of the WEBA signal. The NAND gate 536 is configured to receive the third enable signal E3 and a WEB signal, which is an inverted signal of the WEBB signal.

Therefore, when one port is at write operation and the other port is at read operation in the selected cell, the comparator 32 compares the first row address of the first port and the second row address of the second port, and outputs the first enable signal to the boost circuits 531, 532. Further, the array write replica circuit 54 simulates the write operation and outputs the second enable signal and the third enable signal to the boost circuits 531, 532. Therefore, the boost circuit 531 boosts the first voltage source VDD for the cells arranged in the column according to the first enable signal, the second enable signal and the third enable signal.

Figure 11:
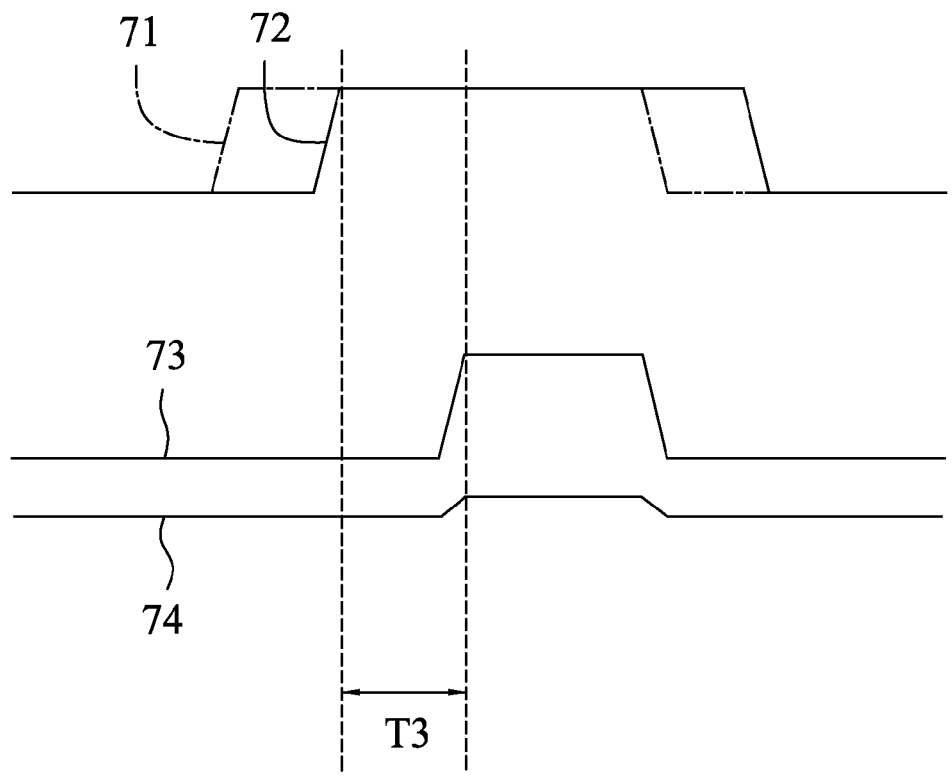
FIG. 11 is a schematic timing diagram illustrating a first port word line, a second port word line, a boost enable signal and the first voltage source in accordance with the embodiments of FIG. 10.

FIG. 11 is a schematic timing diagram illustrating signals on a first port word line 71 and a second port word line 72, a boost enable signal 73 and signals on a first voltage source 74. Referring to FIG. 10 and FIG. 11, in an embodiment, when the first port word line 71 and the second port word line 72 are both logical "H", the two ports of the selected cell simultaneously operate. The boost circuit 531 generates a boost enable signal 73 according to the first enable signal, the second enable signal and the third enable signal, and boosts the first voltage source 74. As stated previously, after delaying the first predetermined time period T3 by simulating the write operation, the first voltage source 74 is boosted during the simultaneous operation period, that is, the overlapping period of the first port word line 71 and the second port word line 72.

Figure 12:
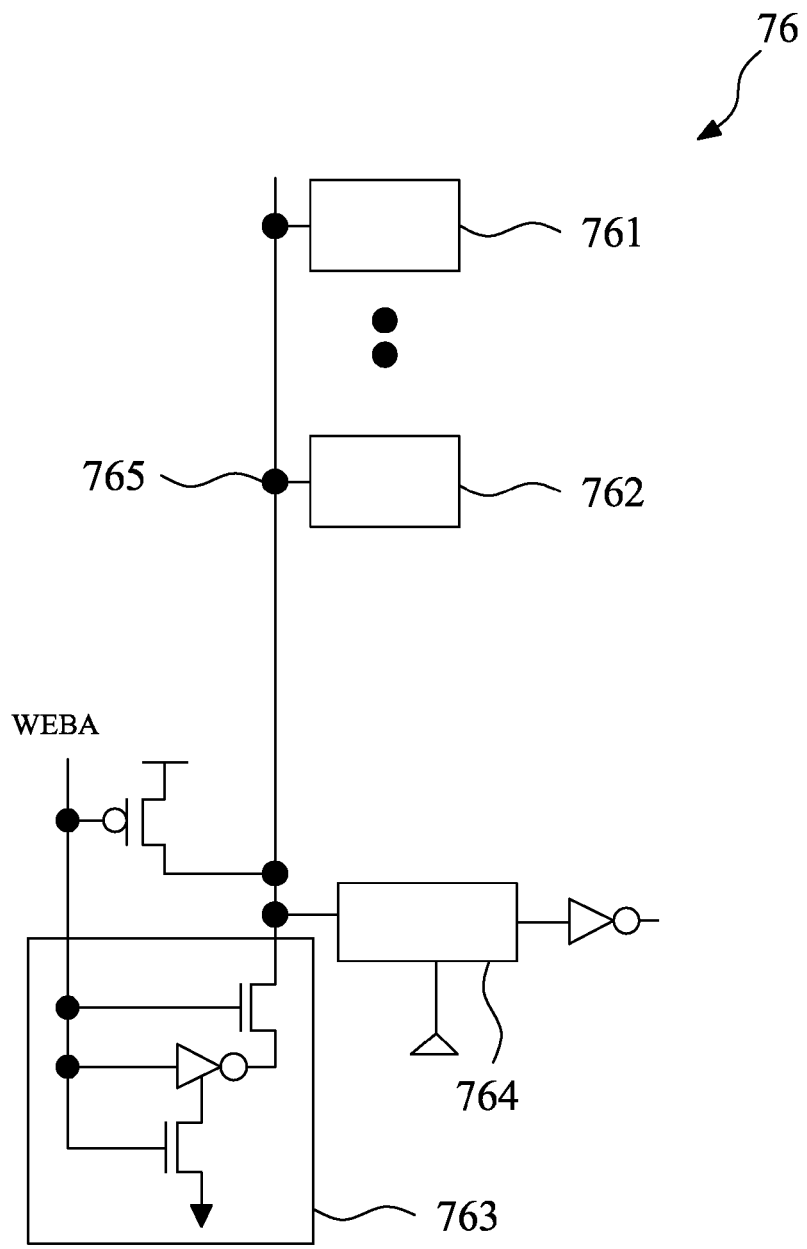
FIG. 12 is a schematic circuit diagram of an array write replica circuit in accordance with some embodiments.

FIG. 12 is a schematic circuit diagram of an array write replica circuit 76 in accordance with some embodiments. Referring to FIG. 12, the array write replica circuit 76 includes several cells 761, 762, a write-replica circuit 763 and a delay circuit 764. The array write replica circuit 76 is configured to track the timing of a cell in the dual-port SRAM when a write operation of the cell is flipped. The first voltage source is boosted only after cell flip when one of the dual ports doing write operation. The cells 761, 762 are the same as the cells 541, 542. The write replica circuit 763 is configured to drive and initiate the write replica, for example, to raise the voltage of the node 765 to be logical "H". In FIG. 12, for illustration purpose, only the write-replica circuit 763 for the first port associated with the WEBA signal is shown. The cells 761, 762 are configured to simulate the write operation. For example, the voltage level at the node 765 is decreased to be logical "L". The delay circuit 764 is configured to further delay a second predetermined time after the cells 761, 762 simulate the write operation and the first predetermined time is delayed. Thus, the delay circuit 764 can be configured to exactly adjust the total delayed time.

Figure 13:
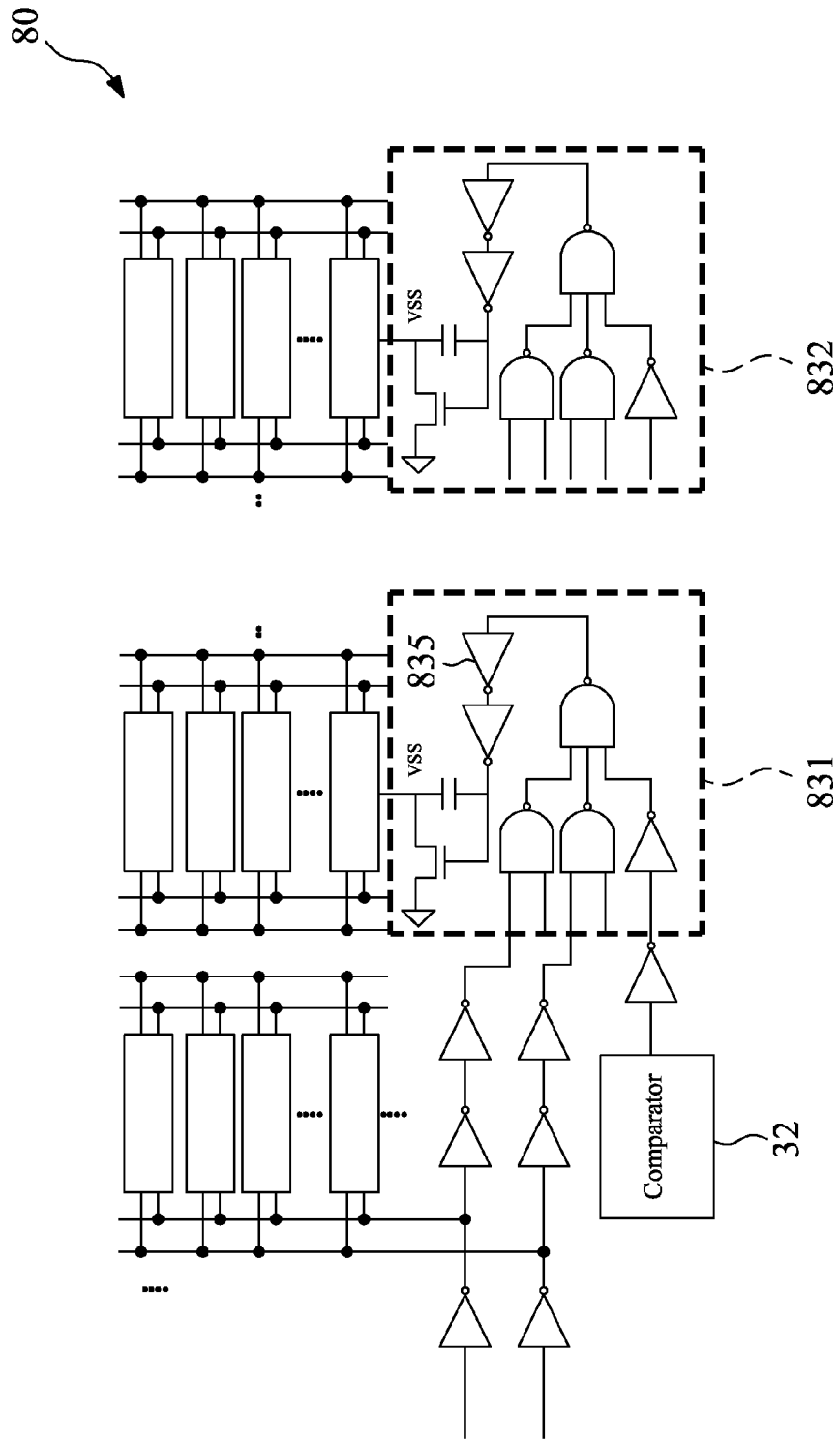
FIG. 13 is a schematic circuit diagram of a dual-port SRAM having a boost system in accordance with some embodiments.

FIG. 13 is a schematic circuit diagram of a dual-port SRAM 80 having a boost system in accordance with some embodiments. The dual-port SRAM 80 is similar to the dual-port SRAM 50 described and illustrated in FIG. 9 except, for example, boost circuits 831, 832. The boost circuits 831, 832 are configured to decrease the second voltage source VSS. Referring to FIG. 13, the boost circuit 831 further includes an inverter 835. Thus, the dual-port SRAM 80 also can boost the voltage difference between the first voltage source and the second voltage source when two ports of the selected cell simultaneously operate.

Figure 14:
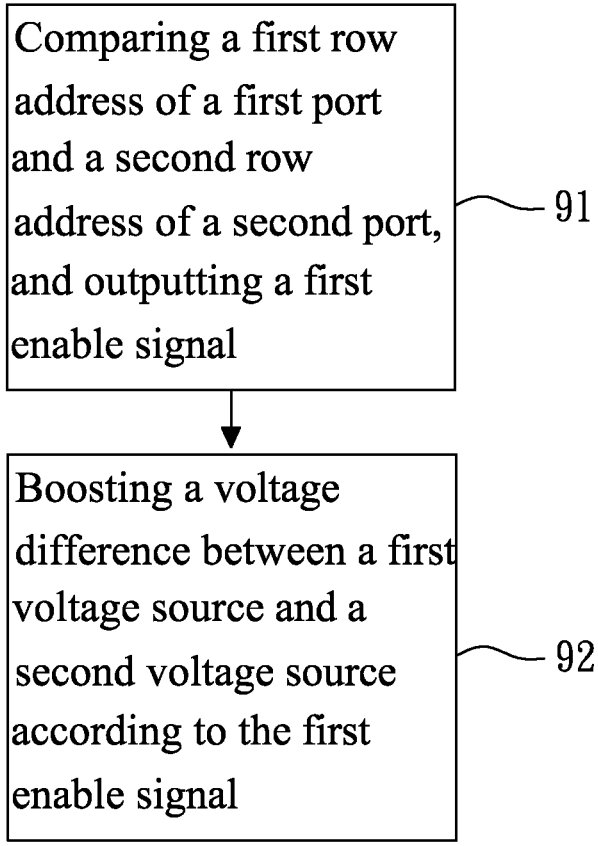
FIG. 14 is a flow chart of a boost method for dual-port SRAM in accordance with some embodiments.

FIG. 14 is a flow chart 90 of a boost method for dual-port SRAM in accordance with some embodiments. The method is performed by the boost system 10 in FIG. 1 or the dual-port SRAM 30 in FIG. 4.

In operation 91, a first row address of a first port and a second row address of a second port in each cell of the dual-port SRAM are compared to determine whether the first row address of the first port is the same as the second row address of the second port. Then, a first enable signal is outputted. If the first row address of the first port is the same as the second row address of the second port in a cell, it means that the two ports of the cell simultaneously operate.

In operation 92, a voltage difference between a first voltage source and a second voltage source is boosted according to the first enable signal. In an embodiment, the first voltage source increases, and the second voltage source is unchanged so that the voltage difference between the first voltage source and the second voltage source can be boosted. In another embodiment, the second voltage source decreases, and the first voltage source is unchanged so as to boost the voltage difference between the first voltage source and the second voltage source.

Figure 15:
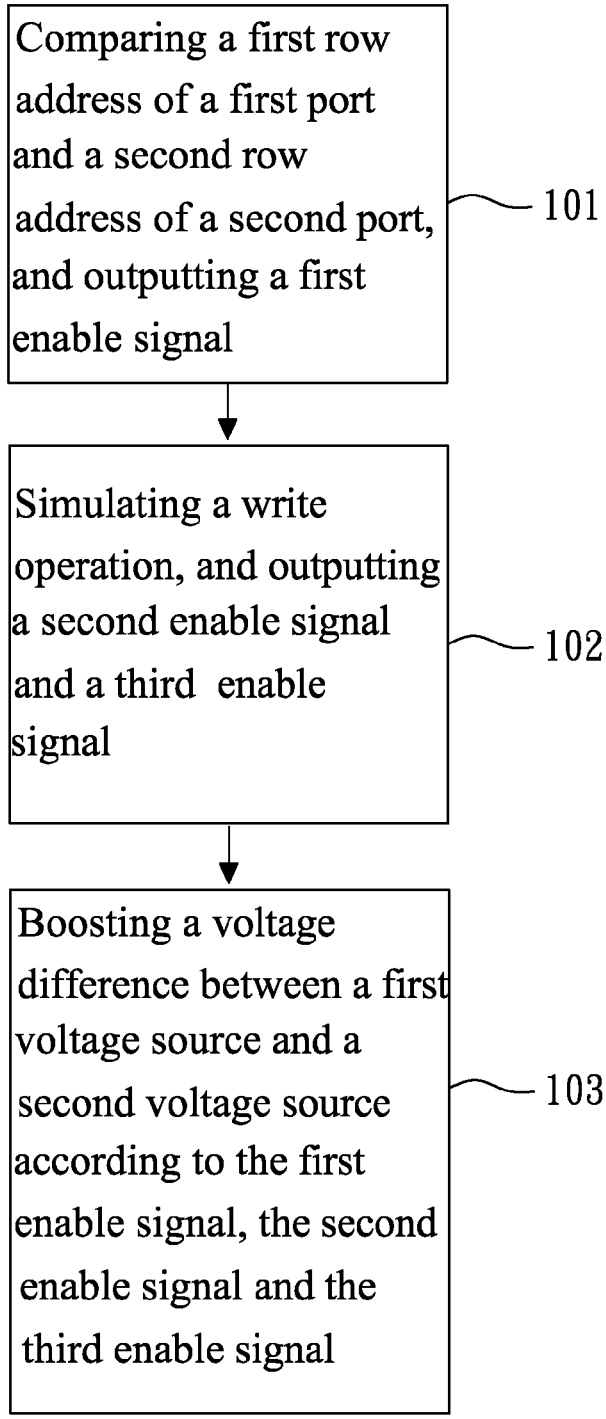
FIG. 15 is a flow chart of a boost method for a dual-port SRAM in accordance with some embodiments.

FIG. 15 is a flow chart 100 of a boost method for dual-port SRAM in accordance with some embodiments. The method is performed by the dual-port SRAM 50 in FIG. 6.

The operation 101 in FIG. 15 is the same as the operation 91 in FIG. 14. In operation 102, a write operation is simulated to delay a first predetermined time, then outputting a second enable signal and a third enable signal. The write operation can be performed by using cells being the same as the cells in the dual-port SRAM so as to simulate the same write operation.

In operation 103, a voltage difference between a first voltage source and a second voltage source is boosted according to the first enable signal, the second enable signal and the third enable signal. Thus, after delaying the first predetermined time by simulating the write operation, the first voltage source increases or the second voltage source decreases during the simultaneous operation period.

Embodiments of the present disclosure provide a boost system (11) for dual-port SRAM (12). The boost system includes a comparator (111) and a boost circuit (112). The comparator is configured to compare a first row address of a first port and a second row address of a second port, and output a first enable signal. The boost circuit (112) is configured to boost a voltage difference between a first voltage source and a second voltage source according to the first enable signal.

Embodiments of the present disclosure provide a dual-port SRAM (30). The dual-port SRAM includes several cells (311, 312), a comparator (32) and a boost circuit (331). The several are arranged in a matrix form, and each cell has a first row address of a first port and a second row address of a second port. The comparator is configured to compare the first row address of the first port and the second row address of the second port, and output a first enable signal. The boost circuit is configured to boost a voltage difference between a first voltage source and a second voltage source according to the first enable signal.

Embodiments of the present disclosure provide a boost method for dual-port SRAM. A first row address of a first port and a second row address of a second port are compared, and a first enable signal is outputted. A voltage difference between a first voltage source and a second voltage source is boosted according to the first enable signal.

A number of embodiments of the disclosure have been described. It will nevertheless be understood that various modifications may be made without departing from the spirit and scope of the disclosure. For example, some transistors are shown to be N-type and some others are shown to be P-type, but the disclosure is not limited to such a configuration. Embodiments of the disclosure are applicable in variations and/or combinations of transistor types.

The above description includes exemplary operations, but these operations are not necessarily required to be performed in the order shown. Operations may be added, replaced, changed order, and/or eliminated as appropriate, in accordance with the spirit and scope of the disclosure. Accordingly, the scope of the disclosure should be determined with reference to the following claims, along with the full scope of equivalences to which such claims are entitled.

What is claimed is:

1. A boost system, comprising:
a comparator configured to compare a first row address of a first port and a second row address of a second port, and output a first enable signal; and
a boost circuit configured to boost a voltage difference between a first voltage source and a second voltage source when the first enable signal indicates that the first row address of the first port and the second row address of the second port are identical.

2. The boost system according to claim 1, wherein the boost circuit is configured to boost the first voltage source.

3. The boost system according to claim 1, wherein the boost circuit is configured to decrease the second voltage source.

4. The boost system according to claim 1, wherein the comparator comprises transistors configured to connect the first row address and the second row address.

5. The boost system according to claim 1, further comprising:
 an array write replica circuit configured to simulate a write operation of a dual-port SRAM, and output a second enable signal and a third enable signal.

6. The boost system according to claim 5, wherein the array write replica circuit comprises a plurality of cells, a write replica circuit and a delay circuit.

7. The boost system according to claim 5, wherein the boost circuit configured to boost the voltage difference according to the first enable signal, the second enable signal and the third enable signal.

8. The boost system according to claim 1, wherein the boost circuit comprises a write driver boost circuit.

9. The boost system according to claim 1, further comprising a dual-port SRAM comprising a plurality of cells arranged in a matrix form, each cell having the first row address of the first port and the second row address of the second port.

10. A boost method for dual-port SRAM, the boost method comprising:
 generating a first enable signal when two ports of a selected cell in the dual-port SRAM simultaneously operate; and
 boosting a voltage difference between a first voltage source and a second voltage source when the first enable signal indicates that two ports of the selected cell in the dual-port SRAM simultaneously operate.

11. The boost method according to claim 10, wherein the first enable signal is generated when a first port word line and a second port word line of two ports of the selected cell are enabled.

12. The boost method according to claim 10, wherein the first voltage source increases according to the first enable signal.

13. The boost method according to claim 10, further comprising:
 simulating a write operation, and outputting a second enable signal and a third enable signal.

14. The boost method according to claim 13, wherein the voltage difference is boosted according to the first enable signal, the second enable signal and the third enable signal.

15. The boost method according to claim 13, wherein the write operation is simulated by delaying a predetermined time.

16. A boost method for dual-port SRAM, the boost method comprising:
 comparing a first row address of a first port and a second row address of a second port, and outputting a first enable signal; and
 boosting a voltage difference between a first voltage source and a second voltage source when the first enable signal indicates that the first row address of the first port and the second row address of the second port are identical.

17. The boost method according to claim 16, wherein the first voltage source increases according to the first enable signal.

18. The boost method according to claim 16, further comprising:
 simulating a write operation, and outputting a second enable signal and a third enable signal.

19. The boost method according to claim 18, wherein the voltage difference is boosted according to the first enable signal, the second enable signal and the third enable signal.

20. The boost method according to claim 18, wherein the write operation is simulated by delaying a predetermined time.

* * * * *